(12) United States Patent
Gregoire

(10) Patent No.: US 9,773,587 B1
(45) Date of Patent: Sep. 26, 2017

(54) TUNABLE CAVITY FOR MATERIAL MEASUREMENT

(71) Applicant: HRL LABORATORIES, LLC, Malibu, CA (US)

(72) Inventor: Daniel J. Gregoire, Thousand Oaks (CA)

(73) Assignee: HRL Laboratories, LLC, Malibu, CA (US)

( * ) Notice: Subject to any disclaimer, the term of this patent is extended or adjusted under 35 U.S.C. 154(b) by 753 days.

(21) Appl. No.: 13/657,070

(22) Filed: Oct. 22, 2012

(51) Int. Cl.
H01B 13/016 (2006.01)
H01B 13/00 (2006.01)

(52) U.S. Cl.
CPC ..... H01B 13/0167 (2013.01); H01B 13/0036 (2013.01)

(58) Field of Classification Search
CPC .... H01P 5/04; H01P 1/181; H01P 7/06; H01P 3/00; H01P 7/04; H01P 1/202; H03H 7/40; H04B 1/0458; G01R 33/34046; G01R 33/34007; Y10T 29/49123; Y10T 29/49016
USPC ........... 333/33, 161, 202, 209, 17.3, 26, 34; 343/909, 701; 324/527, 322, 337, 658
See application file for complete search history.

(56) References Cited

U.S. PATENT DOCUMENTS

| | | | |
|---|---|---|---|
| 3,274,432 A * | 9/1966 | Peterson | H01J 25/56 315/39.63 |
| 3,541,434 A * | 11/1970 | Mullen | 324/642 |
| 5,691,677 A * | 11/1997 | De Maron | H01P 1/2084 333/219.1 |
| 5,748,002 A * | 5/1998 | Scott | G01N 22/00 324/633 |
| 5,889,449 A * | 3/1999 | Fiedziuszko | 333/239 |
| 6,700,458 B2 * | 3/2004 | Mitrovic | H01P 5/024 315/111.21 |
| 8,508,319 B1 * | 8/2013 | Newsham | H01P 1/30 333/231 |
| 8,781,415 B1 * | 7/2014 | Coumou et al. | 455/114.3 |
| 8,957,831 B1 * | 2/2015 | Gregoire et al. | 343/909 |
| 2002/0005725 A1 * | 1/2002 | Scott | G01N 22/00 324/637 |
| 2002/0167457 A1 * | 11/2002 | McKinzie et al. | 343/909 |
| 2002/0175878 A1 * | 11/2002 | Toncich | G01R 27/2694 343/860 |
| 2005/0150278 A1 * | 7/2005 | Troxler | G01N 22/00 73/78 |
| 2006/0160501 A1 * | 7/2006 | Mendolia | H01P 5/04 455/125 |
| 2007/0216497 A1 * | 9/2007 | Krupenkin | H01P 1/184 333/202 |
| 2007/0241843 A1 * | 10/2007 | D'Ostilio | H01P 7/04 333/229 |
| 2007/0290688 A1 * | 12/2007 | Vaughan, Jr. | G01R 33/34046 324/318 |
| 2008/0122531 A1 * | 5/2008 | Kirshner | H01J 25/34 330/44 |

(Continued)

Primary Examiner — Toan Le
Assistant Examiner — Jeffrey Aiello
(74) Attorney, Agent, or Firm — Ladas & Parry

(57) ABSTRACT

An apparatus for measuring material properties of a material under test includes a transmission line, a tunable cavity within the transmission line having a ground plane at an end of the tunable cavity, and a voltage-tunable reactive grid adjacent a beginning of the tunable cavity.

36 Claims, 14 Drawing Sheets

(56) References Cited

U.S. PATENT DOCUMENTS

| | | | |
|---|---|---|---|
| 2009/0140824 A1* | 6/2009 | Hu | H01P 5/10 333/26 |
| 2009/0315780 A1* | 12/2009 | Song et al. | 343/700 MS |
| 2011/0063042 A1* | 3/2011 | Mendolia | H01P 5/04 333/17.3 |
| 2011/0101989 A1* | 5/2011 | Hyde et al. | 324/527 |
| 2013/0207739 A1* | 8/2013 | Bakalski | H03H 7/40 333/33 |

* cited by examiner

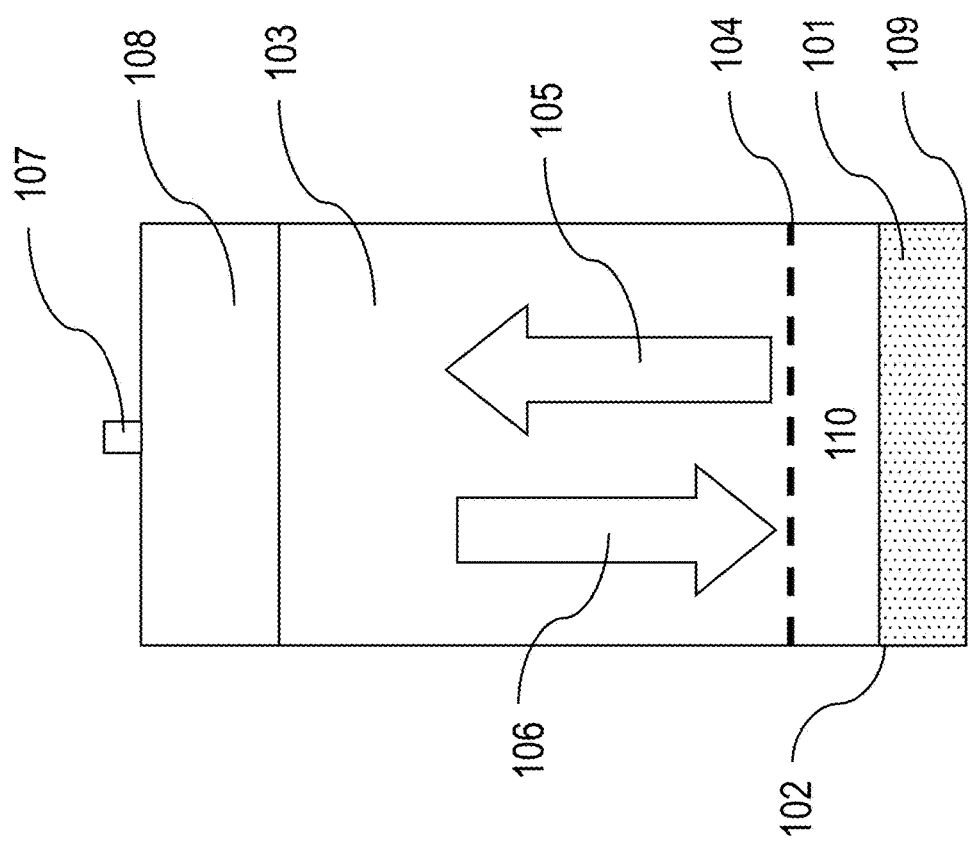

TRANSMITTING AN ELECTROMAGNETIC WAVE THROUGH A TRANSMISSION LINE HAVING A TUNABLE CAVITY WITHIN THE TRANSMISSION LINE, THE TRANSMISSION LINE HAVING A GROUND PLANE AT AN END OF THE TUNABLE CAVITY, AND A VOLTAGE-TUNABLE REACTIVE GRID ADJACENT A BEGINNING OF THE TUNABLE CAVITY
800

DETERMINING THE MATERIAL PROPERTIES OF THE MATERIAL UNDER TEST BY ANALYZING A REFLECTED WAVE
802

WHEREIN THE MATERIAL UNDER TEST IS LOCATED WITHIN THE TUNABLE CAVITY AND BETWEEN THE VOLTAGE-TUNABLE REACTIVE GRID AND THE GROUND PLANE
804

FIG. 14

```
┌─────────────────────────────────────────────────────────┐
│ TRANSMITTING AN ELECTROMAGNETIC WAVE THROUGH A          │
│ TRANSMISSION LINE HAVING A TUNABLE CAVITY WITHIN THE    │
│ TRANSMISSION LINE, THE TRANSMISSION LINE HAVING A       │
│ VOLTAGE-TUNABLE REACTIVE GRID WITHIN THE                │
│ TRANSMISSION LINE AND A SEMI-REFLECTIVE REACTIVE        │
│ GRID WITHIN THE TRANSMISSION LINE                   900 │
└─────────────────────────────────────────────────────────┘
                            │
┌─────────────────────────────────────────────────────────┐
│ DETERMINING THE MATERIAL PROPERTIES OF THE              │
│ MATERIAL UNDER TEST BY ANALYZING A REFLECTED WAVE       │
│ FROM THE MATERIAL UNDER TEST AND A PORTION OF THE       │
│ ELECTROMAGNETIC WAVE THAT IS TRANSMITTED THROUGH        │
│ THE SEMI-REFLECTIVE REACTIVE GRID                   902 │
└─────────────────────────────────────────────────────────┘
                            │
┌─────────────────────────────────────────────────────────┐
│ WHEREIN THE MATERIAL UNDER TEST IS LOCATED WITHIN       │
│ THE TUNABLE CAVITY AND BETWEEN THE VOLTAGE              │
│ -TUNABLE REACTIVE GRID AND THE SEMI-REFLECTIVE      904 │
│ REACTIVE GRID                                           │
└─────────────────────────────────────────────────────────┘
```

TUNABLE CAVITY FOR MATERIAL MEASUREMENT

TECHNICAL FIELD

This disclosure relates to method and apparatus for measuring material properties, and in particular to methods using a tunable cavity.

BACKGROUND

There are many methods for measuring the permittivity and permeability of materials. Among those are the slab method where a slab of material is inserted into a waveguide or coaxial transmission line, and its electrical properties are deduced from a measurement of the phase and magnitude of reflection and transmission through the slab. Such measurements are known as S-parameters. Another method is the microstrip method where the material is used as the substrate for a microstrip transmission line, and the material properties are deduced from the measurements of S parameters at each end of the transmission line. The microstrip method is most commonly used for characterizing the material used in electronic circuit boards. Another method is the cavity method, where the material is inserted into a resonant cavity, and its properties are deduced from measurement of the resonant frequency of the cavity. Another method is to use an impedance analyzer, such as Agilent model No. 4294A, where the electric and magnetic properties are deduced from measurements of the capacitance and inductance of a capacitor and an inductor respectively loaded with the sample material. These are a few of the most common methods used to measure electrical properties. Many more exist.

An important parameter in many applications is the loss the material presents to RF fields due to the complex part of its permittivity and/or its permeability. In many RF applications, it is desirable to use materials with very low loss. Even a very low loss can have a serious impact on the performance of RF devices realized in integrated circuits, such as power amplifiers, low-noise amplifiers, couplers, analog-to-digital converters, phase discriminators, etc. The figure of merit for material loss is known as the loss tangent, which is the ratio of the imaginary part to the real part of the permittivity or the permeability. In some applications, it is important to be able to distinguish between a material with 0.001 loss tangent and 0.002. Measurement of loss tangent to such a degree of accuracy is a formidable task. The impedance analyzer can measure low loss tangents to about an accuracy of 0.001 but it requires the fabrication of two different shaped samples in order to measure both electric and magnetic properties. The microstrip line method gives good measurement of loss if the material lends itself to being fabricated into the microstrip line. However, it is almost exclusively used for materials with no magnetic properties.

Of the methods mentioned above, the cavity method provides the most accurate measurement of low loss tangents because the loss has a major impact on the cavity resonance. At the cavity resonance, the fields in the cavity are very high, and the effects of the material loss on the measurement are magnified. The disadvantage of the cavity method is that it yields the properties at the specific frequency of the resonance. This is satisfactory if the material properties are independent of frequency, or if the resonance frequency is the frequency of interest that the material will be used for. In general, material electric properties vary with frequency, and in some case, they vary greatly. For that reason, it is desirable to be able to measure the frequency dependence of the material properties. For that reason, the cavity resonance method is often implemented with a cavity whose resonant frequency can be tuned by some means. The most common method of tuning is to make the cavity with a mechanically adjustable dimension. For example, one of the cavity walls can be made to slide in and out relative to the other walls. As it slides in, the cavity resonance is driven to higher frequency and vice versa. Another method is to attach an adjustable shunt to the cavity coupled to a phase shifter. As the phase shifter is varied, the cavity resonance is tuned over a limited frequency range.

Sometimes it is desirable to measure material properties at low frequencies where the wavelength is large, sometimes more than a meter or more. Of the methods mentioned above, the impedance analyzer offers the most convenient measurement method at low frequency less than 1 GHz. However, its ability to measure low loss tangents with great accuracy is limited. Also, the technician is required to machine the sample into samples with extremely tight dimensional accuracy for the measurement. Inserting the sample into a coaxial transmission line and measuring its S parameters to deduce its properties is a reliable method for measuring properties over a wide frequency range, but it doesn't provide great accuracy for low-loss materials.

Despite the plethora of property measurement methods, there still exists a need for a way to accurately and simultaneously measure the electric and magnetic properties of low loss tangents materials to high accuracy over a large frequency range with a single material sample in a single device. The embodiments of the present disclosure answer these and other needs.

SUMMARY

In a first embodiment disclosed herein, an apparatus for measuring material properties of a material under test comprises a transmission line, a tunable cavity within the transmission line having a ground plane at an end of the tunable cavity, and a voltage-tunable reactive grid adjacent a beginning of the tunable cavity.

In another embodiment disclosed herein, an apparatus for measuring material properties of a material under test comprises a transmission line, a tunable cavity within the transmission line, a voltage-tunable reactive grid within the transmission line, and a semi-reflective reactive grid within the transmission line.

In yet another embodiment disclosed herein, a method for measuring material properties of a material under test comprises transmitting an electromagnetic wave through a transmission line having a tunable cavity within the transmission line, the transmission line having a ground plane at an end of the tunable cavity, and a voltage-tunable reactive grid adjacent a beginning of the tunable cavity, and determining the material properties of the material under test by analyzing a reflected wave, wherein the material under test is located within the tunable cavity and between the voltage-tunable reactive grid and the ground plane.

In still another embodiment disclosed herein, a method for measuring material properties of a material under test comprises transmitting an electromagnetic wave through a transmission line having a tunable cavity within the transmission line, the transmission line having a voltage-tunable reactive grid within the transmission line and a semi-reflective reactive grid within the transmission line, and determining the material properties of the material under test by analyzing a reflected wave from the material under test and a portion of the electromagnetic wave that is transmitted through the semi-reflective reactive grid, wherein the material under test is located within the tunable cavity and between the voltage-tunable reactive grid and the semi-reflective reactive grid.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 1A and 1B each show an apparatus for measuring material properties in accordance with the present disclosure;

FIG. 14 is a flow diagram of a method for measuring material properties in accordance with the present disclosure; and FIG. 15 is a flow diagram of another method for measuring material properties in accordance with the present disclosure.

DETAILED DESCRIPTION

Figure 1B:
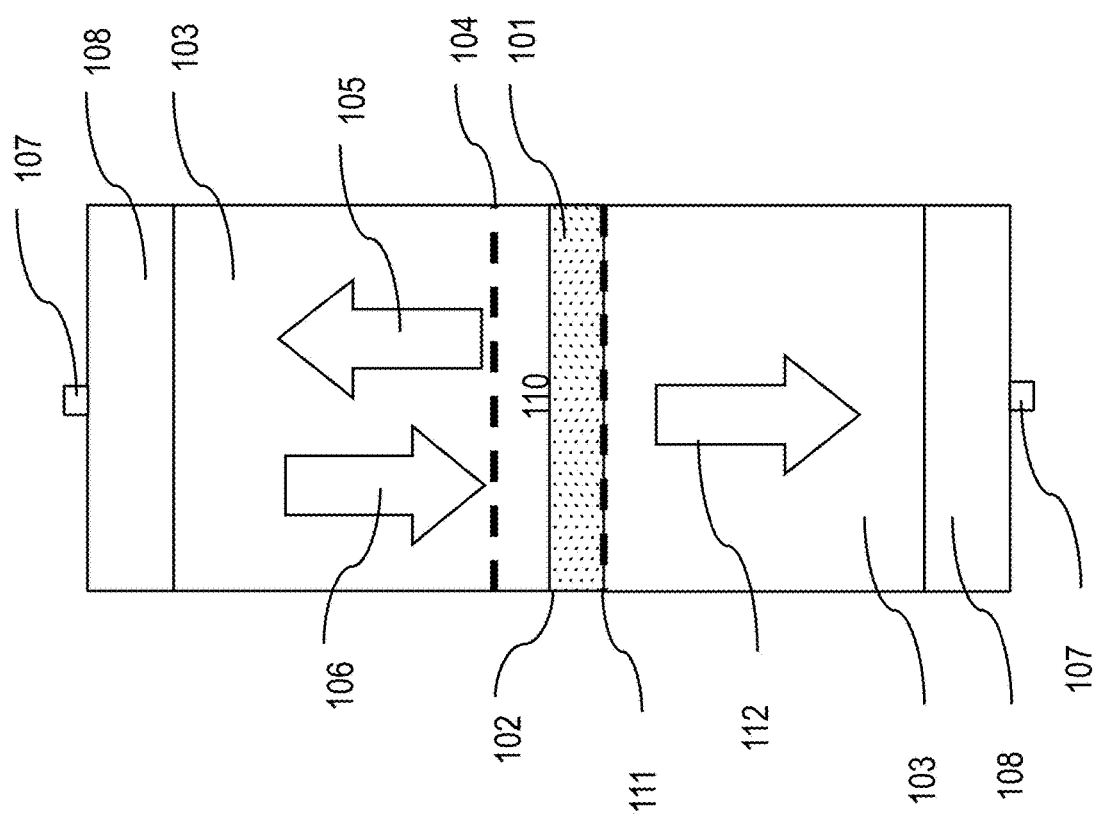

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Referring now to FIG. 1A, the material under test (MUT) 101 is inserted into a tunable cavity 102 within a transmission line 103. The cavity resonance is electrically tunable over a wide frequency range with a voltage-tunable reactive grid (VTRG) 104, which may also be called a voltage-variable reactive grid. The voltage-variable reactive grid forms one of the walls of the tunable cavity 102. The MUT's 101 electric and magnetic properties may be deduced over a large frequency range by measuring the reflection 105 of an incident electromagnetic wave 106 from the MUT-loaded resonant tunable cavity 102 as it is tuned over that frequency range. By tuning the cavity resonance to a desired frequency, the complex permittivity and permeability of the sample of the MUT 101 can be very accurately determined by measuring the reflection properties as a function of tuning voltage and frequency around that resonance. The transmission line (TL) 103 may be terminated with a standard coaxial connector 107 such as N, SMA, BNC, etc., that allows the reflection phase and magnitude from the sample to be recorded with a vector network analyzer. The coaxial connector 107 may be connected to the transmission line 103 with a coax-to-transmission-line coupler 108. If the MUT 101 doesn't fill the cavity 102, then there is an empty space 110 between the VTRG 104 and the MUT 101.

In an alternate embodiment as shown in FIG. 1B, the ground plane 109 is replaced with a semi-reflective reactive grid 111, and the transmission line extends past the MUT 101 and the semi-reflective reactive grid 111. The transmission line is terminated by coax-to-transmission-line couplers 108 and standard coaxial connectors 107 at each end. The semi-reflective reactive grid 111 allows some of the incident radiation to penetrate into the lower portion of the transmission line and is measured at the lower coaxial connector 107. The measurements of the reflected radiation 105 and the transmitted radiation 112 are analyzed to determine the MUT properties.

Figure 2A:
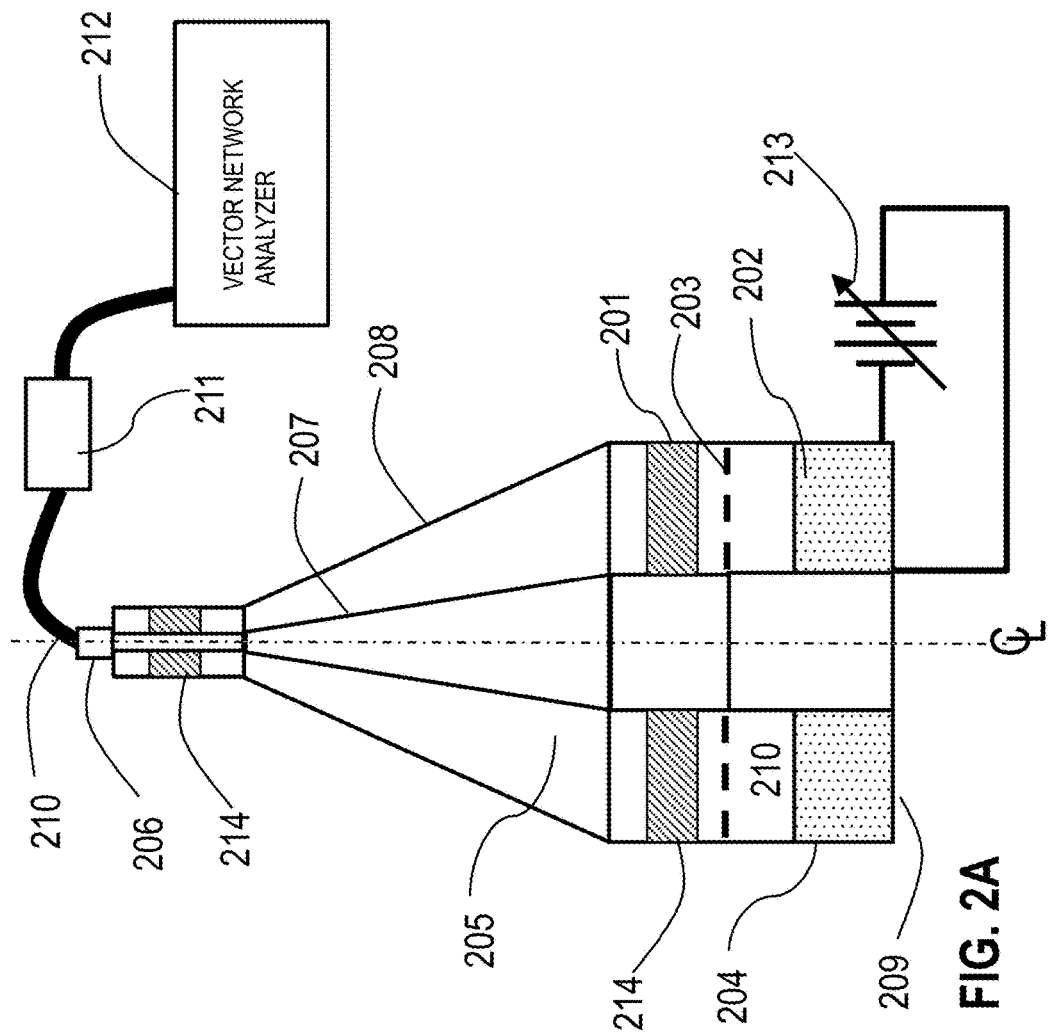
FIGS. 2A and 2B each show other apparatus for measuring material properties in accordance with the present disclosure.

In a preferred embodiment as shown in FIG. 2A, a coaxial transmission line 201 has an inner metallic wall 207 and an outer 208 metallic walls, and the material under test (MUT) 202, voltage-variable reactive grid (VTRG) 203 and tunable cavity 204 are all configured with similar inner and outer walls. Rings 214 of low-loss, low-permittivity structural foam (e.g. made with RohaCell™ RH31; properties: relative permittivity=1.05, loss tangent=0.002) support and locate the inner coaxial wall 207 concentrically with respect to the outer coaxial wall 208. A minimum of two foam rings 214 are necessary at the top and bottom ends of the transmission line. The low-loss, low-permittivity foam 214 allows the inner 207 and outer 208 coaxial walls to be rigidly positioned concentric with respect to each other without impeding the propagation of electromagnetic waves through the transmission line. If the MUT 201 doesn't fill the cavity 204, then there is an empty space 210 between the MUT 201 and the VTRG 203.

The coaxial transmission line allows the incident and reflected waves to propagate as transverse electromagnetic (TEM) waves. The use of TEM waves simplifies the material measurement analysis, and extends the possible measurement frequency range because their fields are uniformly distributed across the MUT cross section, their propagation impedance properties are independent of frequency, they don't have a low-frequency cutoff in the transmission line, and application of the tuning voltage to the VTRG is simplified by applying the voltage differential 213 between the inner and outer coaxial conductors.

For high-fidelity material measurement, it is necessary that the electromagnetic wave propagates through the transmission line without reflection from variations in wave impedance. Therefore, the transition 205 from the coaxial connector 206 to the coaxial tunable cavity 204 is a tapered coaxial transmission line such that the radii of the inner wall 207 and the outer wall 208 maintain a constant ratio along the transmission line from the coaxial connector 206 to the tunable cavity 204. When the wall radii ratio is maintained constant, the electromagnetic wave impedance is also constant throughout the transmission line, and reflections due to impedance mismatches are eliminated. It is preferred to set the wave impedance equal to the impedance of the coaxial connector. Most coaxial connectors have 50-ohm impedance. In alternate embodiments, it may be preferable to have the wave impedance at the MUT end to be different from the wave impedance at the coaxial connector end. In that case, reflection from the impedance variation can be minimized, and measurement fidelity maintained, by slowly tapering the impedance along the transmission line using any one of several impedance taper profiles well known to those skilled in the art.

Figure 2B:
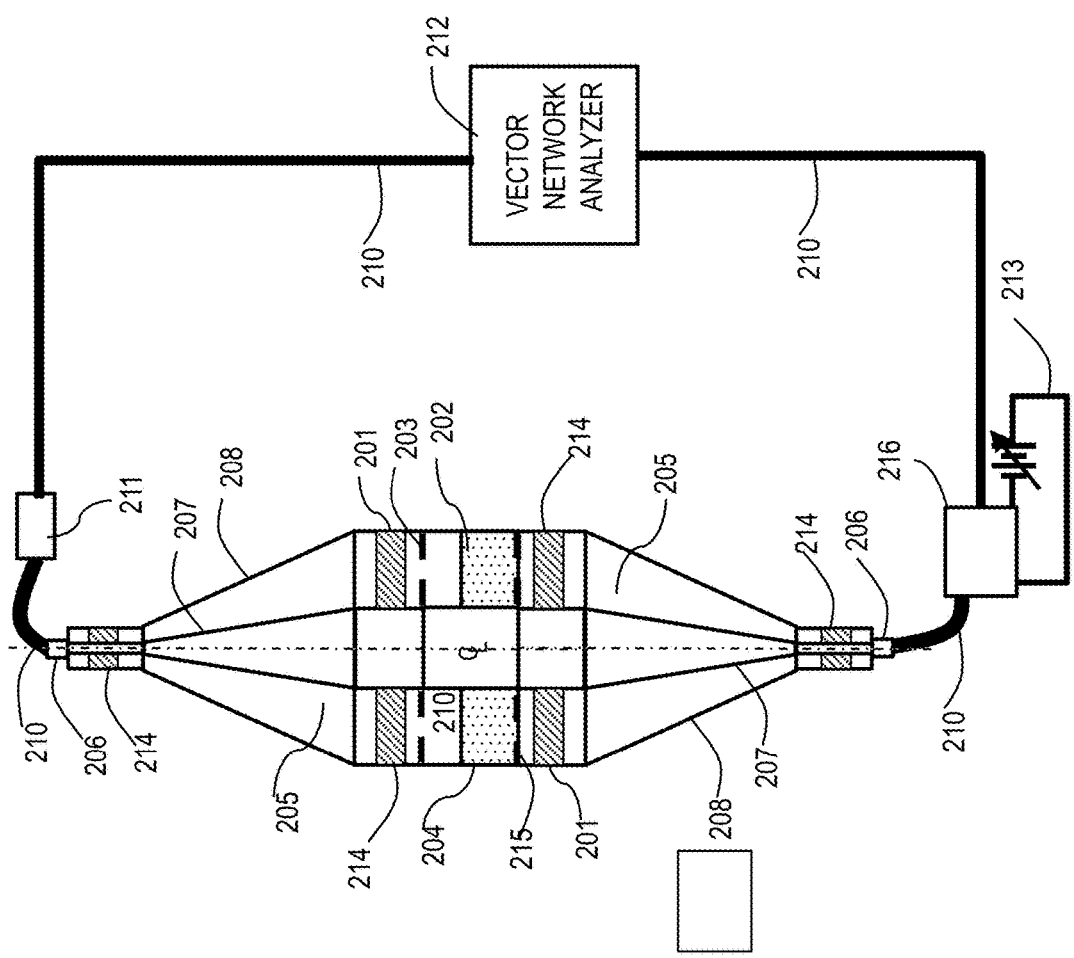
Figure 13:
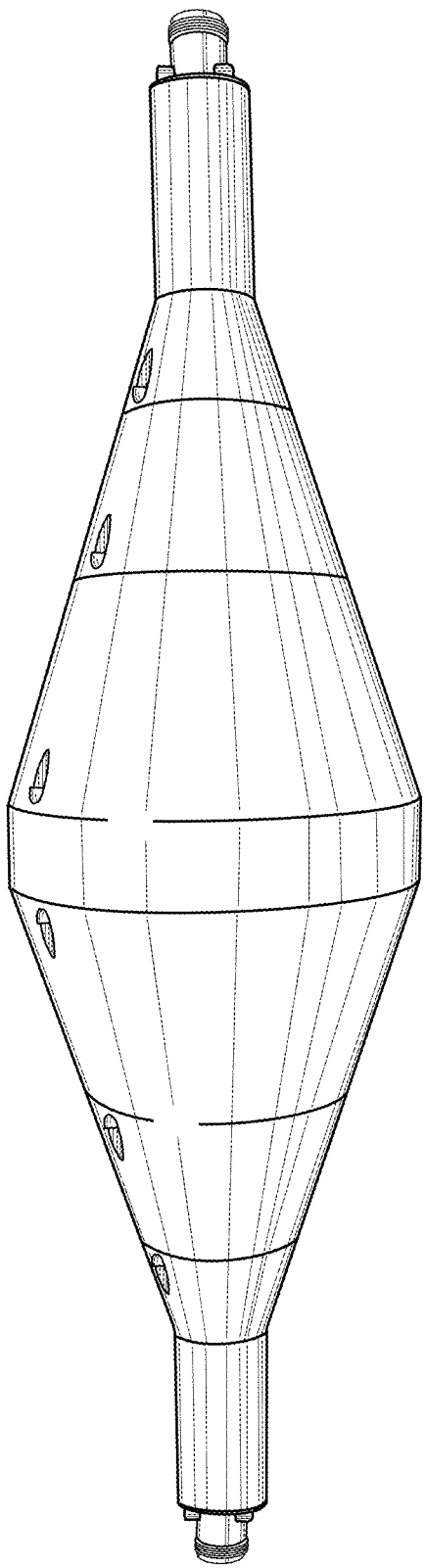
FIG. 13 shows an apparatus for measuring material properties in accordance with the present disclosure.

In another preferred embodiment, as shown in FIGS. 2B and 13, the ground plane 209 is replaced with a semi-reflective reactive grid 215, and the coaxial transmission line extends past the MUT 202 and the semi-reflective reactive grid 215. The transmission line is terminated by standard coaxial connectors 206 at each end. The semi-reflective reactive grid 215 allows some of the incident radiation to penetrate into the lower portion of the transmission line and is measured at the lower coaxial connector 206. The reflected radiation and the transmitted radiation are measured at a two-port vector network analyzer and analyzed to determine the MUT properties. Voltage is applied to the VTRG 203 through a DC-bias Tee 216 connector, such as minicircuits model no. ZFBT-4R2G+. The semi-reflective reactive grid 215 can be made identical to the VTRG 203, or it can be made without the reactive elements between patches, or the reactive elements may be fixed capacitors. The semi-reflective reactive grid 215 must maintain the electrical isolation between the inner and outer coaxial walls.

Figure 3:
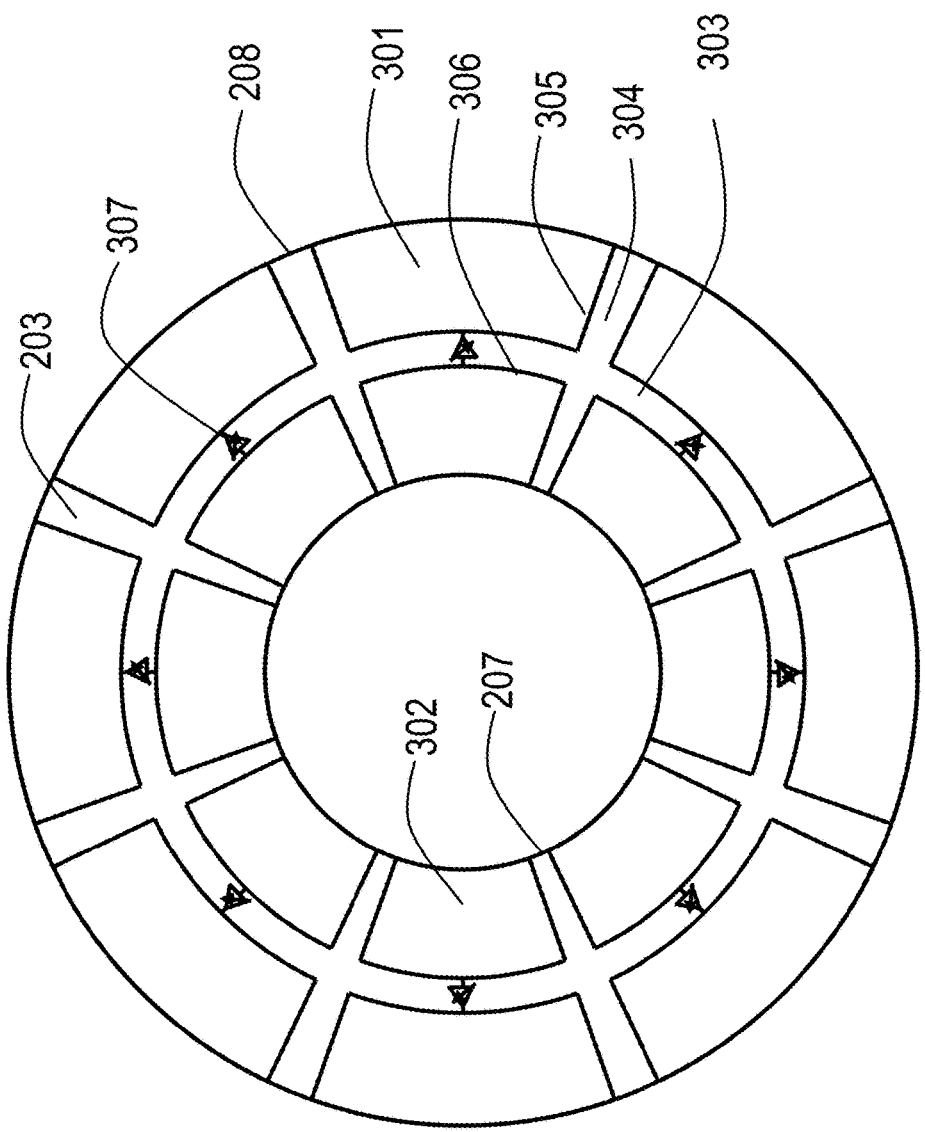
FIG. 3 shows a voltage-tunable reactive grid (VTRG) in accordance with the present disclosure.

The voltage-variable reactive grid (VTRG) 203, as shown in FIG. 3, has two arrays of metallic patches, 301 and 302, in concentric circular arrays. The outer array 301 is adjacent to and hugs the outer diameter 208 of the coax transmission line. The inner array 302 is adjacent to and hugs the inner diameter 207 of the coax transmission line. Each array has an equal number of metallic patches. In the preferred embodiment, there are 8 patches in each array. In alternate embodiments, there may be any number of patches in each array. In the preferred embodiment, each patch subtends an angular portion of an annular region. The angular extent of the patch is an angle less than 360° divided by the number of patches in the array. In alternate embodiments, the patch may assume any shape that maintains electrical connection to the coaxial walls. Also in the preferred embodiment, there is a concentric gap 303 between the two arrays, and a radial gap 304 between neighboring patches in each array. The patches 306 within each array are separated by radial gaps 304. Each patch 306 in the inner array 302 is electrically connected to the inner wall 207 of the coax transmission line, and each patch 305 in the outer array 301 is electrically connected to the outer wall 208 of the coax transmission line. Each patch 306 in the inner array 302 may be radially adjacent to a corresponding patch 305 in the outer array 301.

In a preferred embodiment, the VTRG 203 is formed by printing the arrays of metallic patches onto a substrate of thin low-loss dielectric material, e.g. 0.030" thick Rogers 3003. In alternate embodiments, the arrays can be printed directly onto the material under test (MUT) 202.

Each patch 306 in the inner array 302 is electrically connected to its radially adjacent patch 305 in the outer array 301 with a variable reactive electrical element 307. In the preferred embodiment, this element is a voltage-tunable varactor, such as a Skyworks SMV1235, whose capacitance varies with applied voltage. The voltage is applied with a variable voltage source 213 that is electrically connected to the inner coaxial wall 207 and the outer coaxial wall 208. The inner and outer coaxial walls are electrically isolated from each other with a direct current (DC) block 211 attached between the coaxial cables 210 connecting the coaxial connector 206 to the measurement instrument 212, which is nominally a vector network analyzer.

Figure 4:
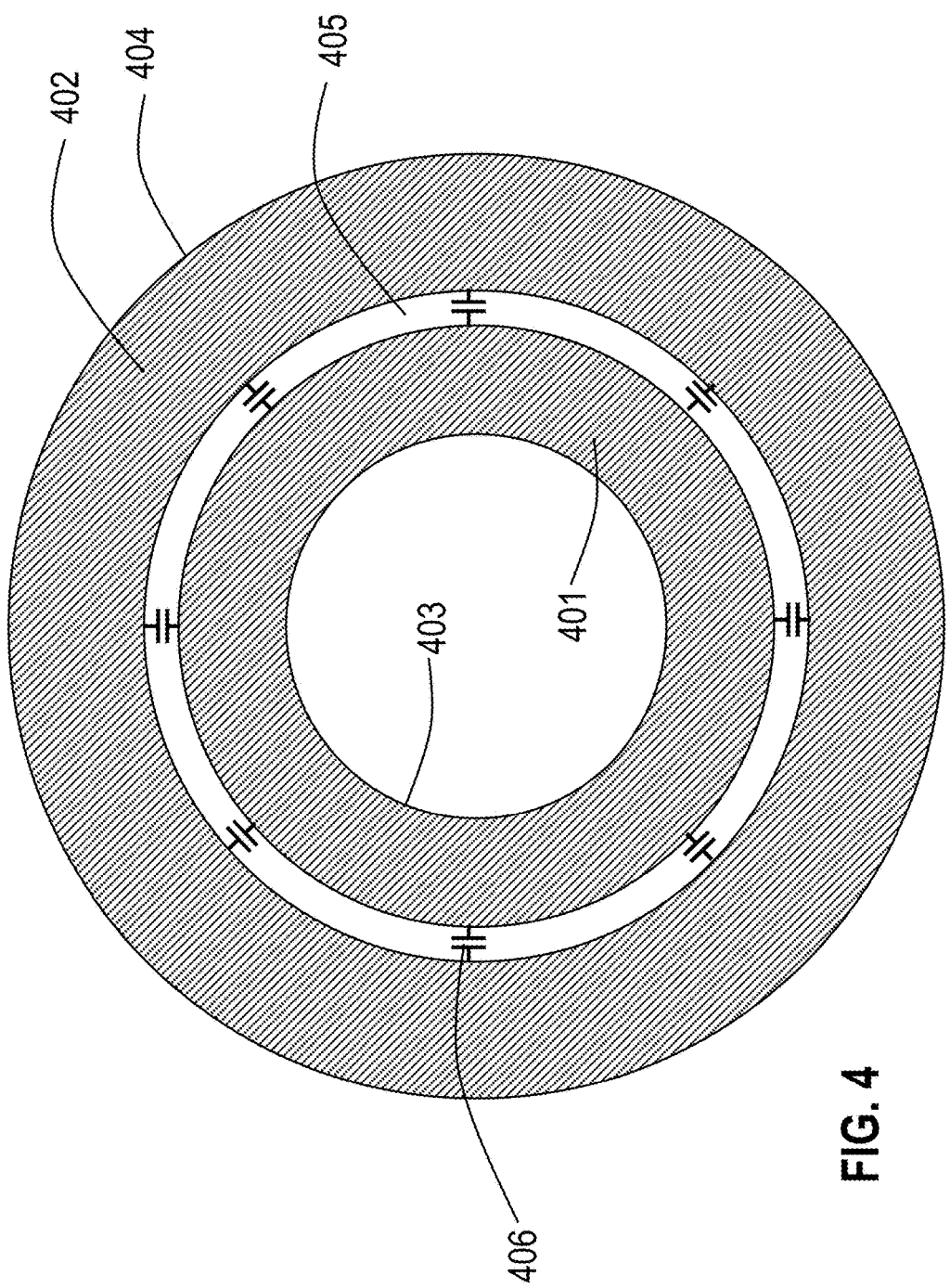
FIG. 4 shows a ground plane in accordance with the present disclosure.

A metallic ground plane (GP) 209 may form the bottom of the tunable cavity 102. In the preferred embodiment, the ground plane 209 is an annular metallic ring that is electrically connected to the inner 207 and outer 208 coaxial walls on its inner and outer radii. In order to prevent the ground plane from shorting out the voltage applied to the variable reactive elements, the ground plane is configured such that it is electrically open to direct current (DC) currents and electrically closed to higher frequency alternating current (AC), also referred to as radio frequency (RF) current. This is accomplished by splitting the ground plane 209, as shown in FIG. 4, into two concentric annular rings 402 and 403 separated by a small radial gap 405, and by electrically connecting RF-shorting capacitors 406 between the two rings. The RF electrical connection between the annular concentric may be produced by soldering discrete capacitors across the gap. The gap and the capacitors prevent DC current from flowing between the inner ring 402 and the outer ring 403. The RF shorting capacitors 406 provide a path for high-frequency RF currents to flow between the two rings. There may be any number of RF shorting capacitors distributed around the circumference of the radial gap 405. The number of RF shorting capacitors 406 may be typically equal to the number of patches in each of the arrays on the VTRG. In a preferred embodiment, 8 RF shorting capacitors 406 are used.

The capacitance of the RF shorting capacitors is chosen to provide low enough impedance in the measurement frequency range of interest such that the two metallic rings in the ground place 209 are essentially shorted to each other at the RF frequency. For example, at 300 MHz, a 100 nF capacitor has an impedance of $1/(2\pi \times 300e6 \times 100e-9) = 0.005\Omega$. The RF shorting capacitors make the ground plane 209 look like a continuous ground plane to the RF wave used to measure the material under test (MUT). The inner radius 403 of the inner concentric ring 401 is electrically connected to the inner coaxial wall 207. The outer radius 404 of the outer concentric ring 402 is electrically connected to the outer coaxial wall 208.

In a preferred mode of operation, the coaxial connector 210 is connected to a Vector Network Analyzer (VNA) 212 with a direct current (DC) block 211 intermediate to their connection. The VNA produces an incident electromagnetic wave 106, and measures the phase and amplitude of the reflected electromagnetic wave 105 that is reflected off the tunable cavity 102 containing the MUT 101. The reflection is measured at several frequencies over a specified range.

The system is calibrated by replacing the tunable cavity 102 with a flat metal sheet, and measuring the reflection phase and magnitude of that sheet. The tunable cavity reflection measurements are calibrated to that data by dividing the complex reflection from the tunable cavity with the MUT 202 by the complex reflection from the metal sheet, and subtracting 180° from the resulting phase component.

Figure 5:
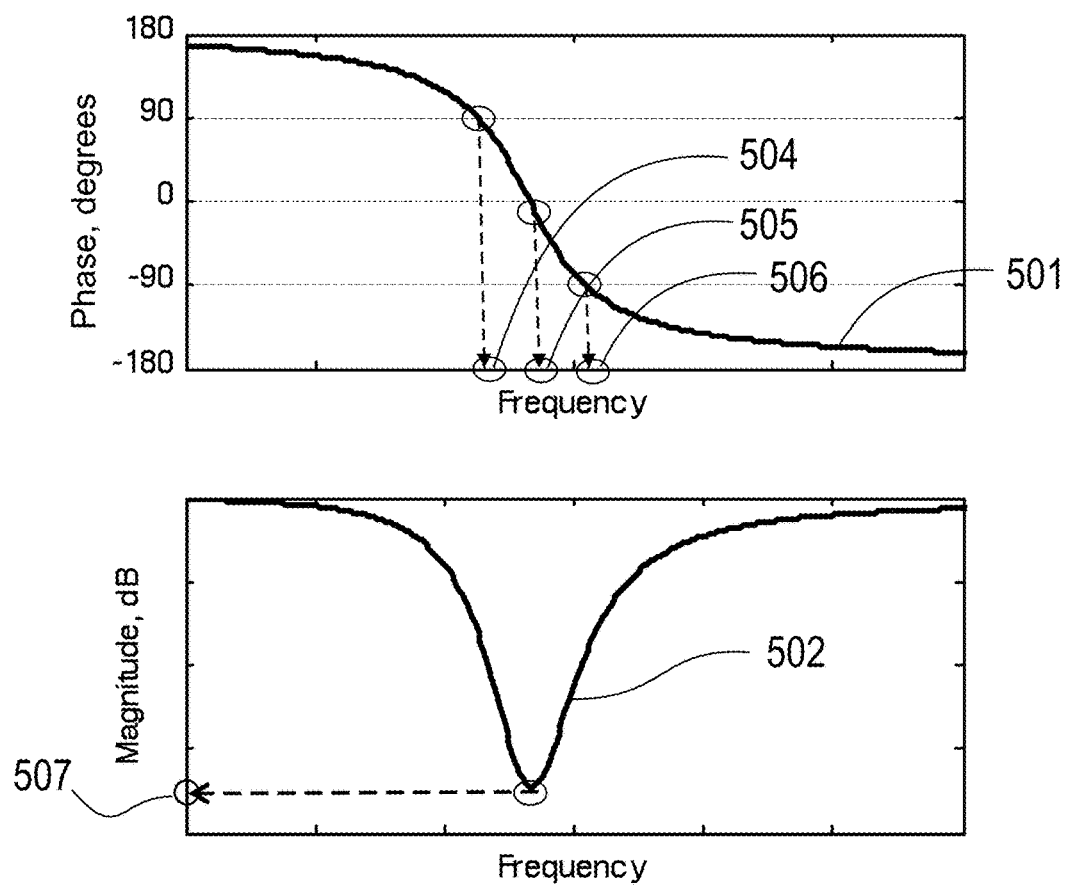
FIG. 5 shows typical plots of calibrated measurements of a reflected wave from a material under test (MUT) in accordance with the present disclosure.
Figure 6:
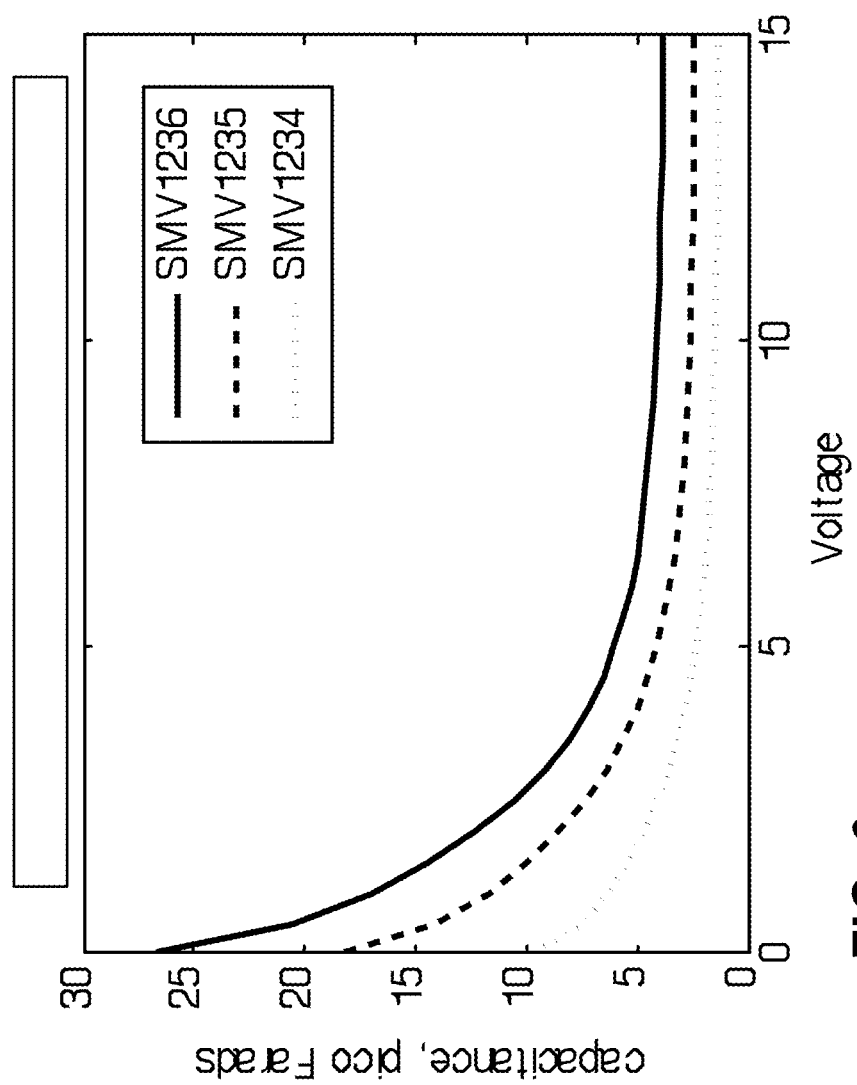
FIG. 6 shows an example of the dependency of capacitance vs. voltage for various varactors in accordance with the present disclosure.

FIG. 5 shows typical plots of calibrated measurement of the reflected wave 105 from the MUT-loaded tunable resonator for a fixed voltage applied to the VTRG 203. In the plots, the wave's phase 501 and magnitude 502 are plotted vs. frequency. The MUT-loaded cavity resonant frequency ($f_0$) 505 is the frequency where the reflection phase 501 passes through 0°, and where the reflection's magnitude 502 is a minimum. As the voltage to the VTRG is varied, the phase and magnitude curves and the resonant frequency shift higher or lower in frequency. When the VTRG voltage is lowered, the VTRG capacitance is increased, and the resonant frequency decreases. When the VTRG voltage is increased, the VTRG capacitance is decreased and the resonant frequency increases. The relationship between the VTRG voltage and its capacitance is dependent on the number of varactors loading the VTRG, and the varactor specifications. For example, FIG. 6 shows a plot of the capacitance vs. voltage dependence for various Skyworks varactors.

Figure 7:
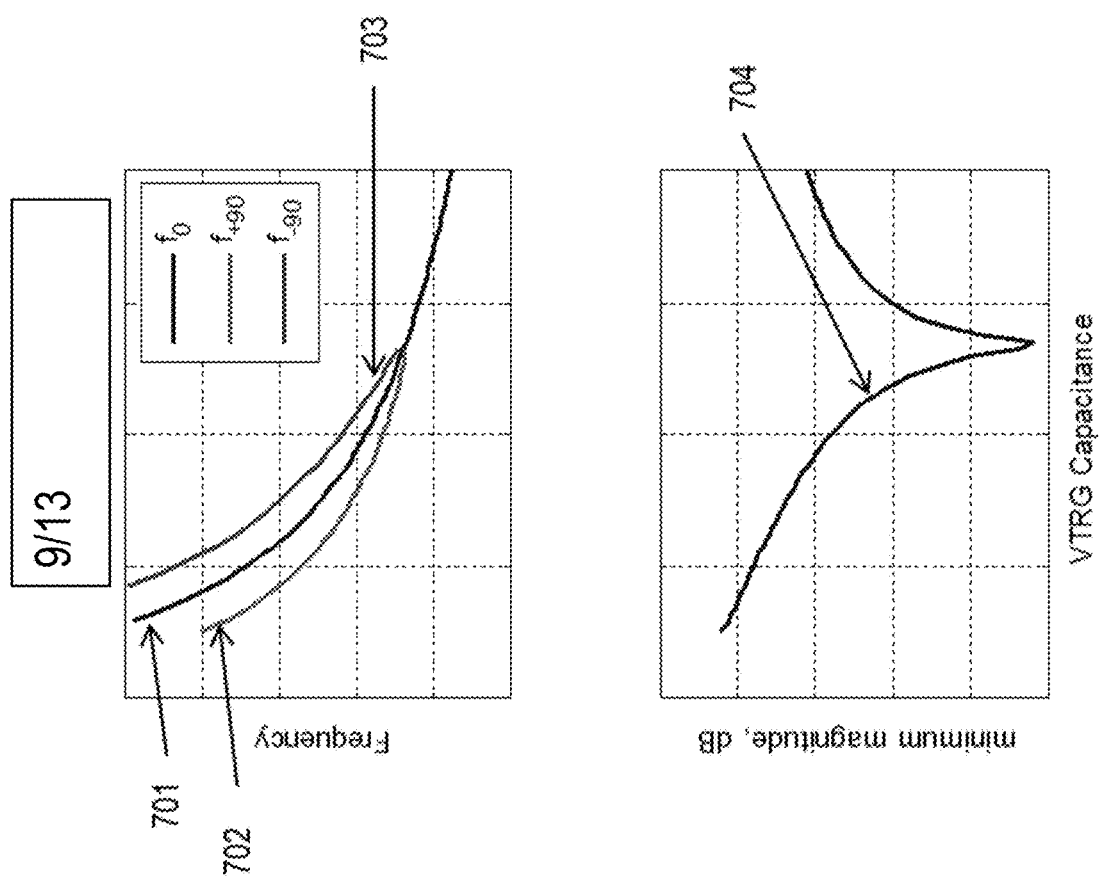
FIG. 7 shows typical curves for frequency vs. VTRG capacitance in accordance with the present disclosure.

The critical parameters in the phase and magnitude curves are the resonant frequency, $f_0$, 505, the frequency where the phase is +90°, $f_{+90}$, 504, the frequency where the phase is −90°, 506, and the reflection magnitude at the resonance, $M_0$, 507. Each of these parameters varies with $C_{VTRG}$. The variation is represented in FIG. 7 which shows typical curves for $f_0$ vs. $C_{VTRG}$ 701, $f_{+90}$ vs. $C_{VTRG}$ 702, $f_{-90}$ vs. $C_{VTRG}$ 703, and $M_0$ vs. $C_{VTRG}$ 704.

For each applied voltage and corresponding VTRG capacitance $C_{VTRG}$, the cavity is resonant at the corresponding frequency $f_0$, 505, that is manifested in the reflection measurement as the frequency where the phase equals 0° and the reflection magnitude is minimum. The reflection measurement at $f_0$ is very sensitive to small changes in the MUT 202 material properties at this frequency, and therefore, the properties extracted at this frequency are very accurate. Very accurate determination of the MUT properties at a wide range of frequencies is found by tuning the resonant frequency by varying the VTRG capacitance.

The MUT 202 material properties at $f_0$ are found by using the following equations that describe the frequency-dependent and capacitance-dependent behavior of the MUT-loaded, tunable resonant cavity.

$\Gamma = Me^{i\phi}$ is the measured complex reflection, where M is the reflection magnitude, and $\phi$ is the reflection phase.

$$Y = Y_0 \frac{1-\Gamma}{1+\Gamma}$$

is the admittance of the tunable cavity, where $Y_0$ is the admittance of the incident wave.

$Y_{VTRG} = i2\pi f C_{VTRG}$ is the admittance of the voltage-tunable reactive grid, where f is the EM-wave frequency.

$$Y_d = \frac{-iY_0 \cot(2\pi fnd/c)}{\eta_r}$$

is the admittance of the MUT, where d is the MUT thickness, c is the speed of light $\eta_r = \sqrt{\mu_r/\epsilon_r}$; $n = \sqrt{\mu_r \epsilon_r}$ are the relative wave impedance and the refractive index of the MUT 202, respectively, and $\epsilon_r$ and $\mu_r$ are the relative permittivity and relative permeability of the MUT 202.

$\epsilon_r$ and $\mu_r$ are the material properties that we want to determine. They can be found by applying the above equations to a transmission line model of the tunable cavity, which yields the following expression for the case where the MUT completely fills the cavity that can be solved for the material properties.

$Y = Y_d + Y_{VTRG}$

One skilled in the state of the art will appreciate that the procedure outlined above for extracting the MUT properties using the above equations is not the only method for performing the calculation. The equations above are simplified in order to teach the conceptual method. In practice, there exist many refinements that can be made to this procedure that will result in more accurate determinations of the properties. For, example, it is advantageous to compare the reflection from an empty tunable cavity 102 to the tunable cavity 102 with the MUT 101 inside. It is also advantageous to fit the solution to calculations at two or more closely spaced frequencies.

The tunable cavity 102 may be constructed of three interlocking pieces for the VTRG 104, MUT 101 and ground plane 109, respectively, that stack on top of each other and are bolted together. This method for the tunable cavity 102 allows different samples to be prepared in modules that can be interchanged in and out of the tunable cavity assembly for rapid measurement of many samples. In a preferred embodiment, each piece in the tunable cavity assembly consists of an inner and outer metal ring with the same dimensions as the coax transmission line. The top and bottom of the ring pieces may be grooved on their horizontal surfaces to mate with complementary grooves in adjacent pieces. The groves allow for indexed mating of the sections. For example, the top surfaces of the VTRG rings have concentric grooves that mate with complementary grooves on the bottom surfaces of the coax transmission line's inner and outer conductors. Alternately, the stack can be indexed with index pins and holes on mating surfaces. Indexing allows the separate pieces to be stacked while maintaining continuity in the interior walls of the coax transmission line and the tunable cavity.

Figure 8:
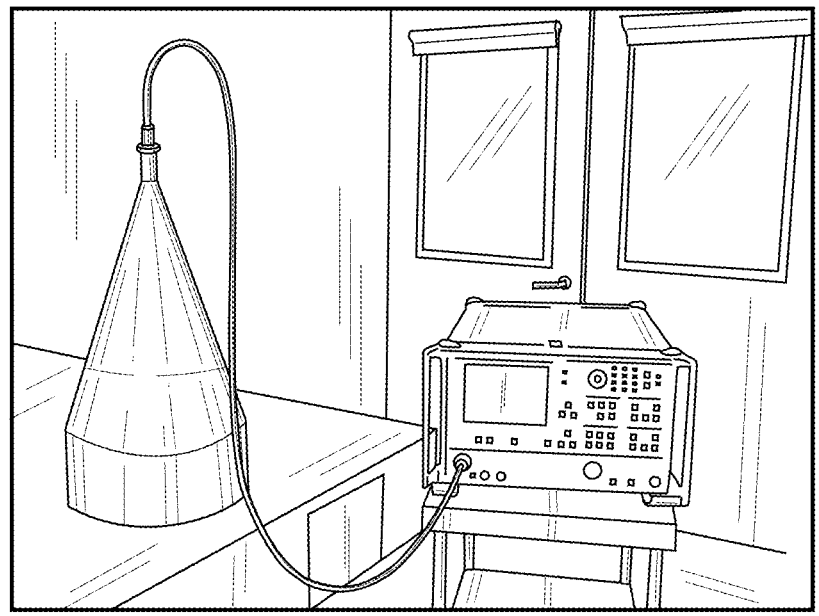
FIG. 8 shows as apparatus for measuring material properties connected to a vector network analyzer as used in a material measurement operation in accordance with the present disclosure.
Figure 9:
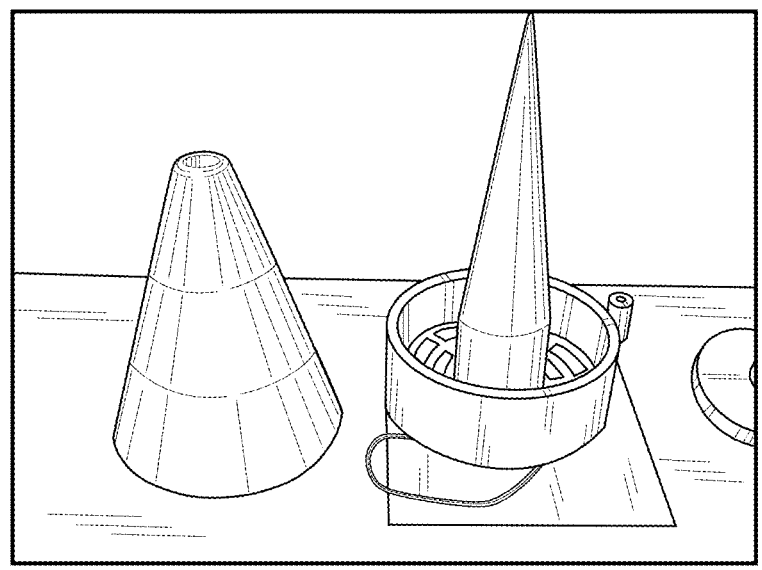
FIG. 9 shows an inner and an outer portion of the coaxial transmission line in accordance with the present disclosure.
Figure 10:
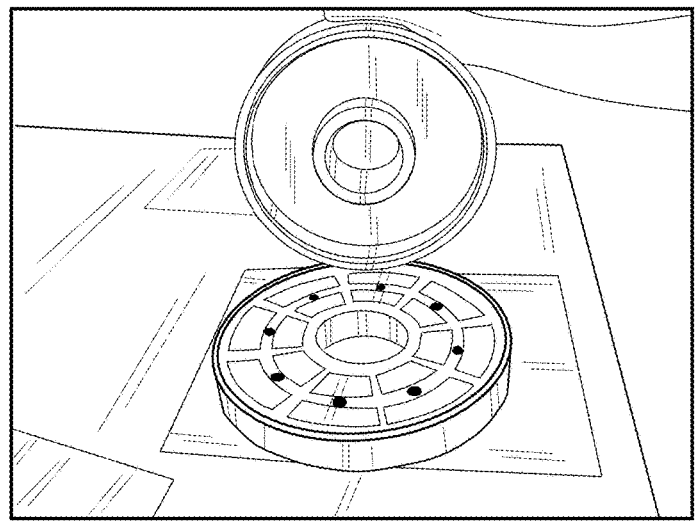
FIG. 10 shows the tunable cavity containing the material under test (MUT) with the VTRG on the top of a MUT in accordance with the present disclosure.
Figure 11:
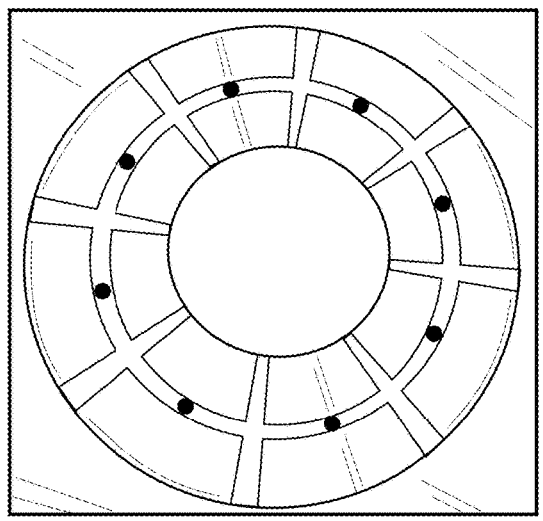
FIG. 11 shows a VTRG in accordance with the present disclosure.
Figure 12:
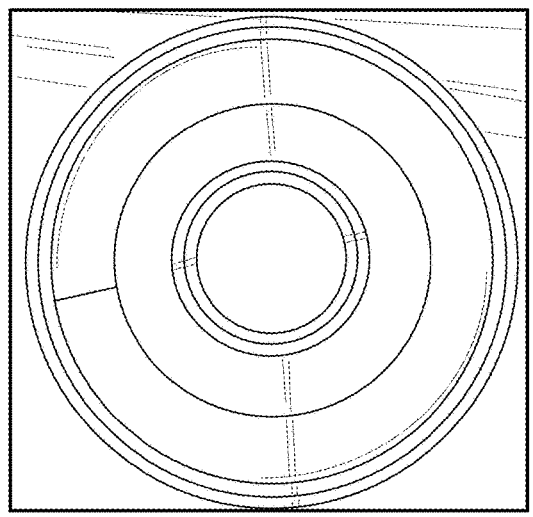
FIG. 12 shows a cavity ground plane with two concentric rings and RF shorting capacitors in the gap between the rings in accordance with the present disclosure.

FIGS. 8 to 12 show the invention as realized in a coaxial form factor. The realized invention is scaled to measure material properties in the range from DC to 500 MHz. FIG. 8 shows the apparatus for measuring material properties connected to a vector network analyzer 212 as used in a material measurement operation. FIG. 9 shows the inner and outer portions of the coaxial transmission line. FIG. 10 shows the tunable cavity containing the MUT and a VTRG is seen on the top of the MUT. FIG. 11 shows the VTRG 203 before assembly into the cavity. FIG. 12 shows the cavity ground plane and shows the ground plane with two concentric rings and 8 RF shorting capacitors 406 between the rings.

In another embodiment, the transmission line is formed with a standard rectangular waveguide. This embodiment can also result in accurate determination of material properties, The equations above need to be modified to incorporate the frequency dependence of the EM-wave impedance in the rectangular waveguide, and the non-uniform field dependence across the waveguide cross section. The MUT properties in this embodiment can only be determined over a narrow frequency band, or less than a 2:1 ratio, that corresponds to the single-mode band of the waveguide. At low frequencies, the waveguide size is extremely large. For example for measurements from 200 to 400 MHz, the waveguide cross section may be approximately 75 cm×37.5 cm. In comparison, the coaxial transmission line method can use a coaxial cavity that is 20 cm in diameter or less. The VTRG design is also more complicated in the rectangular waveguide method, because vias have to pass through the MUT from the metallic patches to the ground plane and an additional bias plane in order supply the voltage to the tuning varactors.

FIG. 14 shows a flow diagram of a method for measuring material properties in accordance with the present disclosure. In step 800 an electromagnetic wave is transmitted through a transmission line having a tunable cavity within the transmission line, the transmission line having a ground plane at an end of the tunable cavity, and a voltage-tunable reactive grid adjacent a beginning of the tunable cavity. Then in step 802 the material properties of the material under test are determined by analyzing a reflected wave. As described by step 804, the material under test is located within the tunable cavity and between the voltage-tunable reactive grid and the ground plane. The material properties may be determined by applying the equations described above.

FIG. 15 shows a flow diagram of another method for measuring material properties in accordance with the present disclosure. In step 900 an electromagnetic wave is transmitted through a transmission line having a tunable cavity within the transmission line, the transmission line having a voltage-tunable reactive grid within the transmission line and a semi-reflective reactive grid within the transmission line. Then in step 902 the material properties of the material under test are determined by analyzing a reflected wave from the material under test and a portion of the electromagnetic wave that is transmitted through the semi-reflective reactive grid. As described by step 904, the material under test is located within the tunable cavity and between the voltage-tunable reactive grid and the semi-reflective reactive grid.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An apparatus for measuring material properties of a material under test comprising:
   a tapered coaxial transmission line having a conductive first inner wall and a conductive first outer wall, wherein the tapered coaxial transmission line is tapered such that a ratio of a radius of the first inner wall and a radius of the first outer wall is constant along a length of the tapered coaxial transmission line;
   a coaxial tunable cavity having a first end and a second end and having a conductive second inner wall and a conductive second outer wall;
   wherein the second inner wall has a first radius equal to a maximum radius of the first inner wall and the second inner wall is connected on the first end of the coaxial tunable cavity to the first inner wall, and the second outer wall has a second radius equal to a maximum radius of the first outer wall and the second outer wall is connected on the first end of the coaxial tunable cavity to the first outer wall;
   a first conductive annular ring coupled to the second inner wall;
   a second conductive annular ring coupled to the second outer wall, wherein the second conductive annular ring is concentric with the first conductive annular ring;
   at least one capacitor coupled between the first conductive annular ring and the second conductive annular ring; and
   a voltage-tunable reactive grid at a location in the coaxial tunable cavity between the first end of the coaxial tunable cavity and the first conductive annular ring and the second conductive annular ring;
   wherein the apparatus is configured to measure a relative permittivity and a relative permeability of the material under test placed between the first conductive annular ring and the second conductive annular ring and the voltage-tunable reactive grid by tuning the coaxial tunable cavity to a desired resonant frequency, transmitting a first electromagnetic wave through the tapered coaxial transmission line to the coaxial tunable cavity, and analyzing a second electromagnetic wave received from the tapered coaxial transmission line.

2. The apparatus of claim 1 wherein the coaxial tunable cavity is between the second inner wall and the second outer wall.

3. The apparatus of claim 1 wherein the voltage-tunable reactive grid comprises:
   a plurality of first metallic patches, each first metallic patch electrically connected to the second inner wall;
   a plurality of second metallic patches, each second metallic patch electrically connected to the second outer wall; and
   a plurality of tunable reactive elements, each respective tunable reactive element coupled between a respective one of the first metallic patches and a respective one of the second metallic patches.

4. The apparatus of claim 3 wherein each tunable reactive element comprises a voltage tunable varactor.

5. The apparatus of claim 1 further comprising:
   a variable voltage source coupled between the second inner wall and the second outer wall.

6. The apparatus of claim 1 further comprising:
a spacer between the second inner wall and the second outer wall to maintain the second inner wall and the second outer wall in a concentric orientation.

7. The apparatus of claim 1 wherein the second conductive annular ring has an outer radius coupled to the second outer wall.

8. The apparatus of claim 1 wherein:
the first conductive annular ring and the second conductive annular ring are metallic.

9. The apparatus of claim 3 wherein the at least one capacitor coupled between the first conductive annular ring and the second conductive annular ring further comprises:
a plurality of capacitors distributed around an outer circumference of the first conductive annular ring;
wherein a first number of the plurality of capacitors is equal to a second number of the plurality of tunable reactive elements.

10. An apparatus for measuring material properties of a material under test comprising:
a first tapered coaxial transmission line having a conductive first inner wall and a conductive first outer wall, wherein the first tapered coaxial transmission line is tapered such that a ratio of a radius of the first inner wall and a radius of the first outer wall is constant along a length of the first tapered coaxial transmission line;
a coaxial tunable cavity having a first end and a second end and having a conductive second inner wall and a conductive second outer wall;
wherein the second inner wall has a first radius equal to a maximum radius of the first inner wall and the second inner wall is connected on the first end of the coaxial tunable cavity to the first inner wall, and the second outer wall has a second radius equal to a maximum radius of the first outer wall and the second outer wall is connected on the first end of the coaxial tunable cavity to the first outer wall;
a voltage-tunable reactive grid at a first location in the coaxial tunable cavity between the first end and the second end of the coaxial tunable cavity;
a semi-reflective reactive grid at a second location in the coaxial tunable cavity between the voltage tunable reactive grid and the second end of the coaxial tunable cavity;
wherein the apparatus for measuring the material properties of the material under test is configured to measure a relative permittivity and a relative permeability of the material under test placed between the voltage-tunable reactive grid and the semi-reflective reactive grid by tuning the tunable cavity to a desired resonant frequency, transmitting a first electromagnetic wave through the tapered coaxial transmission line to the coaxial tunable cavity, and analyzing a second electromagnetic wave received from the second end of the coaxial tunable cavity.

11. The apparatus of claim 10 wherein the coaxial tunable cavity is between the second inner wall and the second outer wall.

12. The apparatus of claim 10 wherein the voltage-tunable reactive grid comprises:
a plurality of first metallic patches, each first metallic patch electrically connected to the second inner wall;
a plurality of second metallic patches, each second metallic patch electrically connected to the second outer wall; and
a plurality of tunable reactive elements, each respective tunable reactive element coupled between a respective one of the first metallic patches and a respective one of the second metallic patches.

13. The apparatus of claim 12 wherein each tunable reactive element comprises a voltage tunable varactor.

14. The apparatus of claim 10 wherein the ground plane comprises:
a first metallic ring electrically connected to the second inner wall;
a second metallic ring electrically connected to the second outer wall;
a plurality of capacitors coupled between the first metallic ring and the second metallic ring.

15. The apparatus of claim 10 further comprising:
a variable voltage source between the second inner wall and the second outer wall.

16. The apparatus of claim 10 further comprising:
a spacer between the second inner wall and the second outer wall to maintain the second inner wall and the second outer wall in a concentric orientation.

17. The apparatus of claim 10 further comprising:
a second tapered coaxial transmission line having a conductive third inner wall connected to the second inner wall and a conductive third outer wall connected to the second outer wall;
wherein the second tapered coaxial transmission line is tapered such that a ratio of a radius of the third inner wall and a radius of the third outer wall is constant along a length of the second tapered coaxial transmission line.

18. A method for measuring material properties of a material under test comprising:
providing:
a tapered coaxial transmission line having a conductive first inner wall and a conductive first outer wall, wherein the tapered coaxial transmission line is tapered such that a ratio of a radius of the first inner wall and a radius of the first outer wall is constant along a length of the tapered coaxial transmission line;
a coaxial tunable cavity having a first end and a second end and having a conductive second inner wall and a conductive second outer wall;
wherein the second inner wall has a first radius equal to a maximum radius of the first inner wall and the second inner wall is connected on the first end of the coaxial tunable cavity to the first inner wall, and the second outer wall has a second radius equal to a maximum radius of the first outer wall and the second outer wall is connected on the first end of the coaxial tunable cavity to the first outer wall;
a first conductive annular ring coupled to the second inner wall;
a second conductive annular ring coupled to the second outer wall, wherein the second conductive annular ring is concentric with the first conductive annular ring;
at least one capacitor coupled between the first conductive annular ring and the second conductive annular ring; and
a voltage-tunable reactive grid at a location in the coaxial tunable cavity between the first end of the coaxial tunable cavity and the first conductive annular ring and the second conductive annular ring; and
measuring a relative permittivity and a relative permeability of the material under test placed between the first conductive annular ring and the second conductive annular ring and the voltage-tunable reactive grid by tuning the coaxial tunable cavity to a desired resonant frequency, transmitting a first electromagnetic wave through the tapered coaxial transmission line to the coaxial tunable cavity, and analyzing a second electromagnetic wave received from the tapered coaxial transmission line.

19. The method of claim 18 wherein the coaxial tunable cavity is between the second inner wall and the second outer wall.

20. The method of claim 18 wherein the voltage-tunable reactive grid comprises:
a plurality of first metallic patches, each first metallic patch electrically connected to the second inner wall;
a plurality of second metallic patches, each second metallic patch electrically connected to the second outer wall; and
a plurality of tunable reactive elements, each respective tunable reactive element coupled between a respective one of the first metallic patches and a respective one of the second metallic patches.

21. The method of claim 20 wherein each tunable reactive element comprises a voltage tunable varactor.

22. The method of claim 18 further comprising:
a variable voltage source coupled between the second inner wall and the second outer wall.

23. The method of claim 18 further comprising:
a spacer between the second inner wall and the second outer wall to maintain the second inner wall and the second outer wall in a concentric orientation.

24. The method of claim 18 wherein measuring the material properties of the material comprises:
determining the material properties at $f_0$ by using the following equations that describe the frequency-dependent and capacitance-dependent behavior of the tunable cavity with the material under test;
$\Gamma = Me^{i\phi}$, a measured complex reflection, where M is a reflection wave magnitude, and $\phi$ is a reflection wave phase;

$$Y = Y_0 \frac{1-\Gamma}{1+\Gamma},$$

an admittance of the tunable cavity, where $Y_0$ is an admittance of the transmitted wave;
$Y_{VTRG} = i2\pi f C_{VTRG}$, an admittance of the voltage-tunable reactive grid, where f is the transmitted wave frequency;

$$Y_d = \frac{-iY_0 \cot(2\pi f n d/c)}{\eta_r},$$

an admittance of the material under test, where d is a material under test thickness, c is a speed of light, $\eta_r = \sqrt{\mu_r/\epsilon_r}$; $n = \sqrt{\mu_r \epsilon_r}$ are a relative wave impedance and a refractive index of the material under test, respectively, and $\epsilon_r$ and $\mu_r$ are the relative permittivity and the relative permeability of the material under test; and
solving the expression $Y = Y_d + Y_{VTRG}$ to determine the material properties.

25. The method of claim 18 wherein the second conductive annular ring has an outer radius coupled to the second outer wall.

26. The method of claim 18 wherein:
the first conductive annular ring and the second conductive annular ring are metallic.

27. The method of claim 20 wherein the at least one capacitor coupled between the first conductive annular ring and the second conductive annular ring further comprises:
a plurality of capacitors distributed around an outer circumference of the first conductive annular ring;
wherein a first number of the plurality of capacitors is equal to a second number of the plurality of tunable reactive elements.

28. A method for measuring material properties of a material under test comprising:
providing:
a first tapered coaxial transmission line having a conductive first inner wall and a conductive first outer wall, wherein the first tapered coaxial transmission line is tapered such that a ratio of a radius of the first inner wall and a radius of the first outer wall is constant along a length of the first tapered coaxial transmission line;
a coaxial tunable cavity having a first end and a second end and having a conductive second inner wall and a conductive second outer wall;
wherein the second inner wall has a first radius equal to a maximum radius of the first inner wall and the second inner wall is connected on the first end of the coaxial tunable cavity to the first inner wall, and the second outer wall has a second radius equal to a maximum radius of the first outer wall and the second outer wall is connected on the first end of the coaxial tunable cavity to the first outer wall;
a voltage-tunable reactive grid at a first location in the coaxial tunable cavity between the first end and the second end of the coaxial tunable cavity; and
a semi-reflective reactive grid at a second location in the coaxial tunable cavity between the voltage tunable reactive grid and the second end of the coaxial tunable cavity; and
measuring a relative permittivity and a relative permeability of the material under test placed between the voltage-tunable reactive grid and the semi-reflective reactive grid by tuning the tunable cavity to a desired resonant frequency, transmitting a first electromagnetic wave through the tapered coaxial transmission line to the coaxial tunable cavity, and analyzing a second electromagnetic wave received from the second end of the coaxial tunable cavity.

29. The method of claim 28 wherein the coaxial tunable cavity is between the second inner wall and the second outer wall.

30. The method of claim 28 wherein the voltage-tunable reactive grid comprises:
a plurality of first metallic patches, each first metallic patch electrically connected to the second inner wall;
a plurality of second metallic patches, each second metallic patch electrically connected to the second outer wall; and
a plurality of tunable reactive elements, each respective tunable reactive element coupled between a respective one of the first metallic patches and a respective one of the second metallic patches.

31. The method of claim 30 wherein each tunable reactive element comprises a voltage tunable varactor.

32. The method of claim 28 wherein the ground plane comprises:
- a first metallic ring electrically connected to the second inner wall;
- a second metallic ring electrically connected to the second outer wall;
- a plurality of capacitors coupled between the first metallic ring and the second metallic ring.

33. The method of claim 28 further comprising:
- a variable voltage source between the second inner wall and the second outer wall.

34. The method of claim 28 further comprising:
- a spacer between the second inner wall and the second outer wall to maintain the second inner wall and the second outer wall in a concentric orientation.

35. The method of claim 28 further comprising:
- a second tapered coaxial transmission line having a conductive third inner wall connected to the second inner wall and a conductive third outer wall connected to the second outer wall;
- wherein the second tapered coaxial transmission line is tapered such that a ratio of a radius of the third inner wall and a radius of the third outer wall is constant along a length of the second tapered coaxial transmission line.

36. The method of claim 28 wherein measuring the material properties of the material comprises:
- determining the material properties at $f_0$ by using the following equations that describe the frequency-dependent and capacitance-dependent behavior of the tunable cavity with the material under test;
- $\Gamma = Me^{i\phi}$, a measured complex reflection, where M is a reflection wave magnitude, and $\phi$ is a reflection wave phase;

$$Y = Y_0 \frac{1-\Gamma}{1+\Gamma},$$

an admittance of the tunable cavity, where $Y_0$ is an admittance of the transmitted wave;
- $Y_{VTRG} = i2\pi f C_{VTRG}$, an admittance of the voltage-tunable reactive grid, where f is the transmitted wave frequency;

$$Y_d = \frac{-iY_0 \cot(2\pi fnd/c)}{\eta_r},$$

an admittance of the material under test, where d is a material under test thickness, c is a speed of light, $\eta_r = \sqrt{\mu_r/\epsilon_r}$; $n = \sqrt{\mu_r \epsilon_r}$ are a relative wave impedance and a refractive index of the material under test, respectively, and $\epsilon_r$ and $\mu_r$ are the relative permittivity and the relative permeability of the material under test; and
- solving the expression $Y = Y_d + Y_{VTRG}$ to determine the material properties.

* * * * *